United States Patent
Park et al.

(10) Patent No.: US 7,633,763 B1
(45) Date of Patent: Dec. 15, 2009

(54) DOUBLE MOLD MEMORY CARD AND ITS MANUFACTURING METHOD

(75) Inventors: Chul Woo Park, Kangdong-gu (KR); Suk Gu Ko, Kangdong-gu (KR); Sang Jae Jang, Kwanggin-gu (KR); Sung Su Park, Kwanggin-gu (KR); Choon Heung Lee, Kwangju-shi (KR)

(73) Assignee: Amkor Technology, Inc., Chandler, AZ (US)

( * ) Notice: Subject to any disclaimer, the term of this patent is extended or adjusted under 35 U.S.C. 154(b) by 1030 days.

(21) Appl. No.: 10/766,101

(22) Filed: Jan. 28, 2004

(51) Int. Cl.
  *H05K 7/02* (2006.01)
  *H05K 7/06* (2006.01)
  *H05K 7/08* (2006.01)
  *H05K 7/10* (2006.01)

(52) U.S. Cl. .................. 361/760; 361/736; 361/737

(58) Field of Classification Search ......... 361/736–737; 257/788–790
  See application file for complete search history.

(56) References Cited

U.S. PATENT DOCUMENTS

| | | | |
|---|---|---|---|
| 3,668,299 A | 6/1972 | McNeal | |
| 4,532,419 A | 7/1985 | Takeda | |
| 4,905,124 A | 2/1990 | Banjo et al. | |
| 4,974,120 A | 11/1990 | Kodai et al. | |
| 5,172,214 A | 12/1992 | Casto | |
| 5,244,840 A * | 9/1993 | Kodai et al. | 29/841 |
| 5,360,992 A | 11/1994 | Lowrey et al. | |
| 5,574,309 A | 11/1996 | Papaietro et al. | |
| 5,617,297 A * | 4/1997 | Lo et al. | 361/737 |
| 5,729,894 A * | 3/1998 | Rostoker et al. | 29/832 |
| 5,742,479 A | 4/1998 | Asakura | |
| 5,753,532 A | 5/1998 | Sim | |
| 5,784,259 A | 7/1998 | Asakura | |
| 5,822,190 A | 10/1998 | Iwasaki | |
| 5,893,724 A * | 4/1999 | Chakravorty et al. | 438/108 |
| 5,977,613 A | 11/1999 | Takata et al. | |
| 6,040,622 A | 3/2000 | Wallace | |
| 6,143,981 A | 11/2000 | Glenn | |
| 6,145,023 A * | 11/2000 | Iwasaki | 710/13 |
| D445,096 S | 7/2001 | Wallace | |
| D446,525 S | 8/2001 | Okamoto et al. | |
| 6,384,472 B1 | 5/2002 | Huang | |
| 6,417,444 B1 * | 7/2002 | Hirai et al. | 174/368 |
| 6,433,285 B2 * | 8/2002 | Maeda et al. | 174/260 |
| 6,476,469 B2 | 11/2002 | Hung et al. | |
| 6,545,332 B2 | 4/2003 | Huang | |
| 6,603,196 B2 | 8/2003 | Lee et al. | |
| 6,624,005 B1 | 9/2003 | Di Caprio et al. | |

(Continued)

FOREIGN PATENT DOCUMENTS

JP    3112688    5/1991

(Continued)

*Primary Examiner*—Tuan T Dinh
(74) *Attorney, Agent, or Firm*—Stetina Brunda Garred & Brucker

(57) ABSTRACT

A memory card comprising a substrate having opposed top and bottom surfaces and a plurality of terminals disposed on the bottom surface thereof. Mounted to the top surface of the substrate is at least one component which is itself electrically connected to the terminals of the substrate. Formed on the bottom surface of the substrate is a first encapsulation part. Formed on the top surface of the substrate is a second encapsulation part which encapsulates the component mounted thereto.

24 Claims, 5 Drawing Sheets

U.S. PATENT DOCUMENTS

| | | | |
|---|---|---|---|
| 6,988,668 B2 * | 1/2006 | Osako et al. | 235/492 |
| 2002/0140068 A1 | 10/2002 | Lee | |
| 2002/0190429 A1 * | 12/2002 | Bolken | 264/272.11 |
| 2005/0030723 A1 * | 2/2005 | Miks et al. | 361/752 |

FOREIGN PATENT DOCUMENTS

| | | |
|---|---|---|
| JP | 7017175 | 1/1995 |
| JP | 8190615 | 7/1996 |
| JP | 10334205 | 12/1998 |

* cited by examiner

DOUBLE MOLD MEMORY CARD AND ITS MANUFACTURING METHOD

CROSS-REFERENCE TO RELATED APPLICATIONS

Not Applicable

STATEMENT RE: FEDERALLY SPONSORED RESEARCH/DEVELOPMENT

Not Applicable

BACKGROUND OF THE INVENTION

1. Field of the Invention

The present invention relates generally to memory cards, and more particularly to a memory card (e.g., a multi-media card (MMC)) which is fabricated through the implementation of a two-stage molding process.

2. Description of the Related Art

As is well known in the electronics industry, memory cards are being used in increasing numbers to provide memory storage and other electronic functions for devices such as digital cameras, MP3 players, cellular phones, and personal digital assistants. In this regard, memory cards are provided in various formats, including multi-media cards and secure digital cards.

Typically, memory cards include multiple electronic components such as integrated circuit devices, semiconductor dies, passive components, and the like. The components are often interconnected using a circuit board substrate. Memory cards also include electrical contacts or terminals for providing an external interface to an insertion point or socket. These electrical contacts are typically disposed on one side or face of the circuit board substrate, with the electrical connection to the components mounted to the substrate being provided by conductive vias and traces which extend through and along the substrate.

In certain memory cards, a leadframe assembly is used as an alternative to the circuit board substrate, as is described in Applicant's co-pending U.S. application Ser. No. 09/956,190 entitled LEAD-FRAME METHOD AND ASSEMBLY FOR INTERCONNECTING CIRCUITS WITHIN A CIRCUIT MODULE filed Sep. 19, 2001.

In those memory card configurations which in employ the use of the above-described substrate having one or more electrical devices or components mounted thereto, such components are typically covered or protected by a cap or lid (sometimes referred to as a "skin") which is separately fabricated and attached to the substrate. The cap is typically fabricated through the implementation of an injection molding process, and is subsequently adhesively secured to the substrate in a manner covering or shielding the components mounted thereto. The cap is typically fabricated such that when mounted to the substrate, the resultant memory card meets or achieves a desired a desired "form factor." As will be recognized, the requirement of separately fabricating the cap significantly increases the manufacturing cost for the prior art memory card, in addition to decreasing yield rate due to the need to carry out a separate process or step to mechanically couple the cap to the substrate. This separate coupling process also increases the susceptibility of the internal components mounted to the substrate of being contaminated with various particles. The present invention addresses and overcomes these deficiencies of currently known memory cards by providing a memory card wherein the cap or lid is eliminated in favor of a two-stage molding process, These and other attributes of the present invention will be described in more detail below.

BRIEF SUMMARY OF THE INVENTION

In accordance with the present invention, there is provided a double mold memory card wherein first and second encapsulation parts are separately formed on a substrate, and used as an alternative to a conventional cap or lid. The first and second encapsulation parts are formed via the implementation of a two stage molding process wherein the first encapsulation part is initially formed on a surface of the substrate of the memory card including the conductive contacts or terminals thereof, which is followed by the formation of a second encapsulation part on an opposed surface of the substrate having one or more electrical components mounted thereto and electrically connected to the terminals of the substrate. As such, the second encapsulation part effectively covers or encapsulates the component(s) of the memory card. The elimination of the separate cap or lid lowers manufacturing costs while increasing yield rate.

The present invention is best understood by reference to the following detailed description when read in conjunction with the accompanying drawings.

BRIEF DESCRIPTION OF THE DRAWINGS

These, as well as other features of the present invention, will become more apparent upon reference to the drawings wherein.

Common reference numerals are used throughout the drawings and detailed description to indicate like elements.

DETAILED DESCRIPTION OF THE INVENTION

Figure 1A:
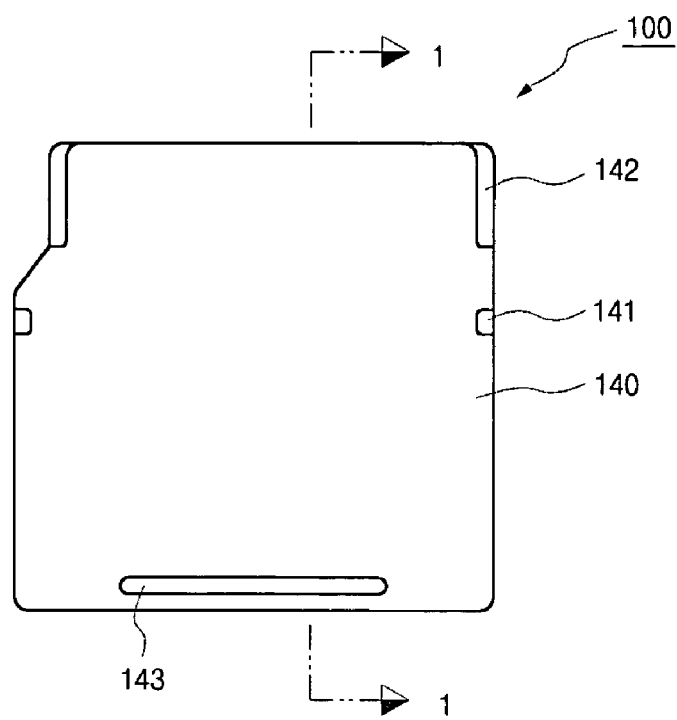
FIG. 1A is a top plan view of a memory card constructed in accordance with the present invention.
Figure 1B:
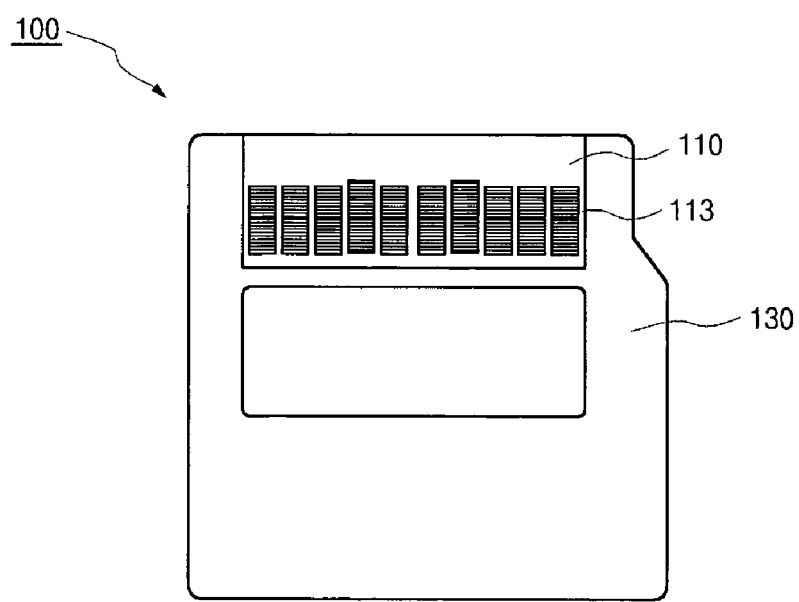
FIG. 1B is a bottom plan view of the memory card shown in FIG. 1A.
Figure 1C:
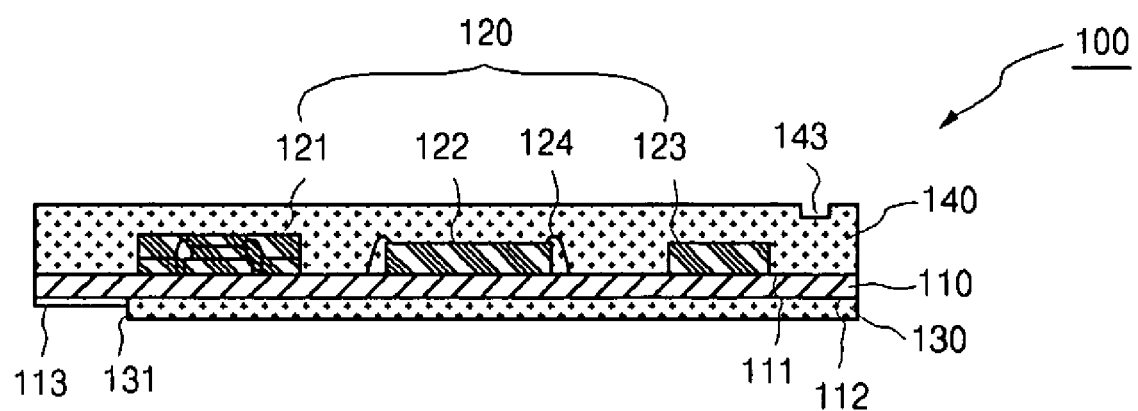
FIG. 1C is a cross-sectional view of the memory card of the present invention taken along line 1-1 of FIG. 1A.

Referring now to the drawings wherein the showings are for purposes of illustrating a preferred embodiment of the present invention only, and not for purposes of limiting the same, FIGS. 1A-1C depict a memory card 100 constructed in accordance with the present invention. The memory card 100 comprises a substrate 110 which defines a generally planar top surface 111 and an opposed, generally planar bottom surface 112. Disposed on the bottom surface 112 of the substrate 110 in relative close proximity to one of the peripheral edge segments thereof is a plurality of contacts or terminals 113. As will be recognized, the terminals 113 are used to facilitate the electrical connection of the memory card 100 to an external device. Thus, in addition to being exposed in the memory card 100 as will be described in more detail below, the terminals 113 are oriented so as to be placeable into electrical communication with corresponding pins of a host socket connector into which the memory card 100 is completely or partially advanced. The substrate 110 may comprise a rigid printed circuit board (PCB), a flexible PCB, a leadframe, or a similar suitable structure. Those of ordinary skill in the art will recognize that the present invention is not limited to any particular material for the substrate 110.

Mounted to the top surface 111 of the substrate 110 is a plurality of semiconductor parts or electronic components 120. As shown in FIG. 1C, the depicted components 120 include at least one semiconductor package 121, at least one semiconductor die 122, and at least one passive component 123. In the memory card 100, the components 120 are electrically connected to the substrate 110 and more particularly to the terminals 113 included on the bottom surface 112 thereof. More particularly, it is contemplated that the substrate 110 will be provided with conductive vias and traces which extend therethrough and therealong in any pattern as needed to accommodate the component(s) 120 included in the memory card 100. As further seen in FIG. 1C, the semiconductor package 121 and the passive component 123 are surface-mounted to the top surface 111 of the substrate 110 and to the conductive traces which facilitate the electrical connection to the terminals 113. The semiconductor die 122 is shown as being electrically connected to the conductive traces of the substrate 110 through the use of conductive wires 124.

Those of ordinary skill in the art will recognize that the type, number and arrangement of components 120 shown in FIG. 1C is exemplary only, in that one component 120 or multiple components 120 of any type may be mounted and electrically connected to the substrate 110 in any number, combination or pattern depending on the desired application for the memory card 100. All that is necessary is that the substrate 110 be configured to facilitate the electrical communication between any component(s) 120 and the terminals 113. Along these lines, the number of terminals 113 included on the substrate 110 in the memory card 100 is also variable, in that the number of terminals 113 may be varied according to the particular application for the memory card 100.

In addition to the substrate and components 120, the memory card 100 comprises a first encapsulation part 130 which is formed on the bottom surface 112 of the substrate 110. As seen in FIGS. 1B and 1C, the first encapsulation part 130 is preferably formed to be of substantially uniform thickness, and includes an opening or slot 131 formed in a predetermined area thereof. More particularly, the slot 131 is disposed in and extends inwardly from one peripheral edge segment of the first encapsulation part 130, the slot 131 being oriented so as to facilitate the exposure of the terminals 113 when the first encapsulation part 130 is formed on the bottom surface 112 of the substrate 110. The first encapsulation part 130 effectively protects the substrate 110 from the external environment, and enhances the overall rigidity of the memory card 100 as will be discussed in more detail below. The first encapsulation part 130 may be formed from an epoxy mold compound, and may be fabricated by filling or injecting such epoxy mold compound into a mold after placing the substrate 110 into a suitably shaped mold cavity of the mold.

In addition to the first encapsulation part 130, the memory card 100 includes a second encapsulation part 140 which is formed on the top surface 111 of the substrate 110. Like the first encapsulation part 130, the second encapsulation part 140 is preferably formed to be of uniform thickness, and is adapted to protect the components 120 from the external environment. Since the second encapsulation part 140 effectively covers or encapsulates the components 120, the second encapsulation part 140 is significantly thicker than the first encapsulation part 130. The second encapsulation part 140 is also preferably formed from an epoxy mold compound, and is fabricated by filling or injecting such epoxy mold compound into a mold after placing the substrate 110 into a suitably shaped mold cavity thereof.

As seen in FIGS. 1A and 1C, the second encapsulation part 140 is preferably formed to include a notch 141 of predetermined depth within each of an opposed pair of sides or peripheral edge segments thereof. The opposed notches 141 within the second encapsulation part 140 are used to facilitate the coupling of the memory card 100 to an external device. Also, the second encapsulation part 140 is also preferably formed to include an opposed pair of elongate guide slots or openings 142 within respective ones of an opposed pair of sides or peripheral edge segments thereof. The guide openings 142 preferably extend in spaced, generally parallel relation to the elongate terminals 113 of the substrate 110, and are used to assist in guiding the memory card 100 into an external device. Also formed in the second encapsulation part 140 is a slot 143 of predetermined depth. Slot 143 is formed in close proximity to that side or peripheral edge segment of the second encapsulation part 140 which is disposed furthest from the terminals 113 of the substrate 110. The slot 143 is used to assist in the removal of the memory card 100 from an external device. Those of ordinary skill in the art will recognize that the shapes and locations of the notches 141, the guide openings 142, and the slot 143 can be varied according to the configuration of the external device with which the memory card 100 is to be used. Additionally, the shapes of the first and second encapsulation parts 130, 140 may be varied from that shown in FIGS. 1A-1C depending on the desired form factor for the memory card 100.

Figure 2A:
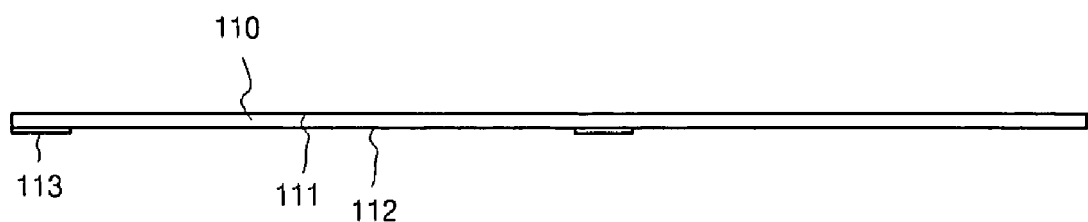
FIGS. 2A-2E illustrate an exemplary sequence of steps which may be used to facilitate the fabrication of the memory card shown in FIGS. 1A-1C.
Figure 2B:
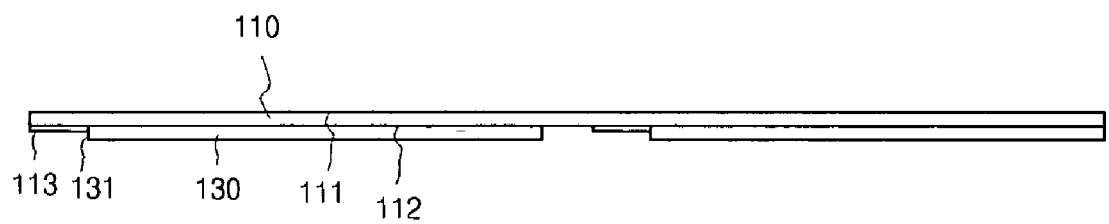

Referring now to FIGS. 2A-2E, there is shown an exemplary sequence of steps which may be used to facilitate the fabrication of the memory card 100 of the present invention. The initial step of the fabrication method comprises providing the substrate 110 having the above-described structural attributes (FIG. 2A). As shown in FIG. 2A, multiple substrates 110 are initially interconnected to each other in a common strip or structure. Thereafter, a first encapsulation part 130 having the above-described structural attributes is formed on the bottom surface 112 of each substrate 110 (FIG. 2B). As is seen in FIG. 2B, each first encapsulation part 130 is formed such that the terminals 113 of the corresponding substrate 110 are not covered thereby. Additionally, the first encapsulation parts 130 are not integrally connected to each other, but are disposed in spaced relation to each other on the strip including the multiple substrates 110.

Figure 2C:
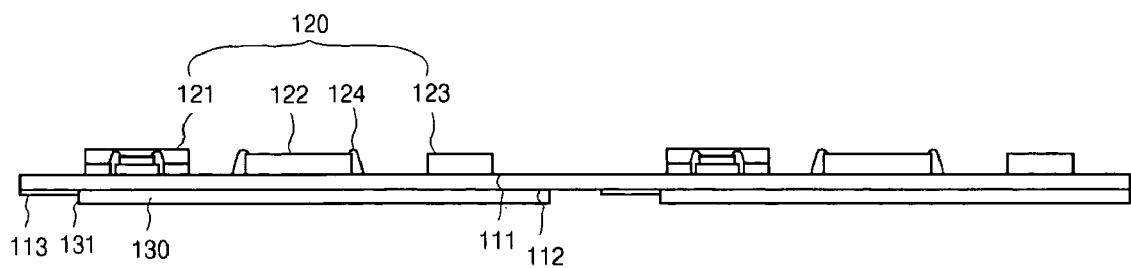
Figure 2D:
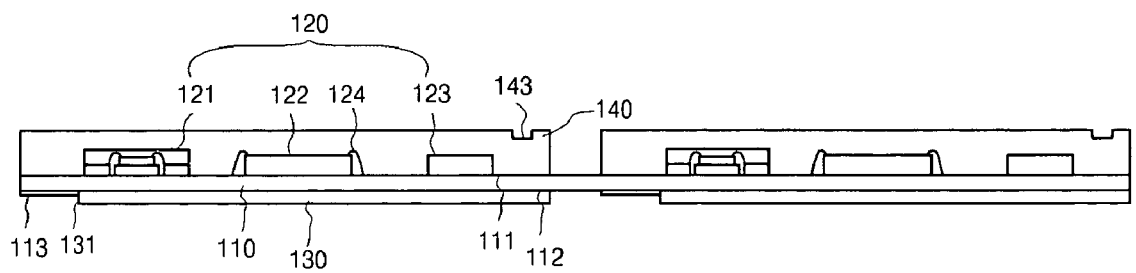
Figure 2E:
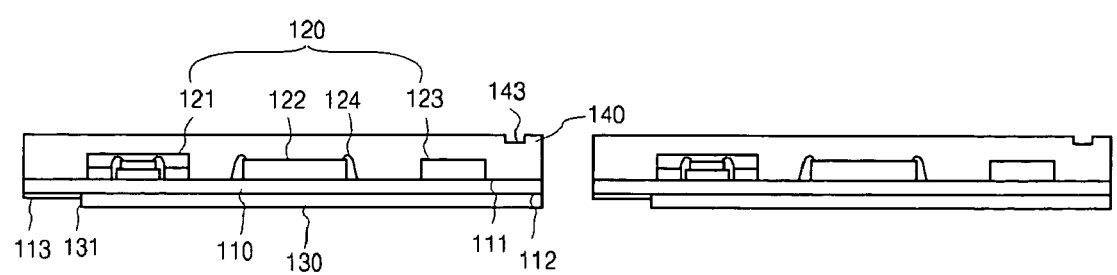

Subsequent to the formation of the first encapsulation parts 130, the component(s) 120 are mounted and electrically connected to each of the substrates 110 in the above-described manner (FIG. 2C). Thereafter, a second encapsulation part 140 is formed on the top surface 111 of each substrate 110 in the above-described manner to cover or encapsulate the components(s) 120 mounted and electrically connected to the substrate 110 (FIG. 2D). Finally, a singulation step is completed to effectively separate the fully formed memory cards 100 from each other (FIG. 2E). As shown in FIG. 2E, a predetermined area of the strip including the substrates 110 is sawed or cut to facilitate the formation of the individual double mold memory cards 100 of the present invention, each fully formed memory card 100 including a substrate 110, the component(s) 120 mounted and electrically connected to the substrate 110, the first encapsulation part 130, and the second encapsulation part 140. Those of ordinary skill in the art will recognize that the fabrication steps described above are equally applicable to forming a memory card 100 from a single substrate 110, as opposed to simultaneously fabricating multiple memory cards 100 from multiple substrates 110 integrally connected to each other in a single strip which is ultimately cut or singulated in the above-manner.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process, may be implemented by one of skill in the art in view of this disclosure.

What is claimed is:

1. A memory card, comprising:
a substrate having opposed top and bottom surfaces and a plurality of terminals disposed on the bottom surface thereof;
at least one component mounted to the top surface of the substrate and electrically connected to the terminals thereof;
a first encapsulation part formed on the bottom surface of the substrate; and
a second encapsulation part formed on the top surface of the substrate and encapsulating the component mounted thereto, the second encapsulation part being completely separated from the first encapsulation part by the substrate;
the first and second encapsulation parts each being exposed in the memory card.

2. The memory card of claim 1 wherein the first encapsulation part is formed to include an opening therein, the terminals of the substrate being exposed in the opening.

3. The memory card of claim 1 wherein:
the second encapsulation part defines an opposed pair of sides; and
a pair of coupling notches are formed in respective ones of the sides of the second encapsulation part in opposed relation to each other.

4. The memory of claim 1 wherein:
the terminals of the substrate extend in spaced, generally parallel relation to each other;
the second encapsulation part defines an opposed pair of peripheral edge segments which extend in spaced, generally parallel relation to the terminals; and
a pair of guide slots are formed in respective ones of the peripheral edge segments in opposed relation to each other.

5. The memory card of claim 1 wherein the second encapsulation part includes a recess formed therein adjacent a peripheral edge segment of the second encapsulation part disposed furthest from the terminals.

6. The memory card of claim 1 wherein the first encapsulation part and the second encapsulation part are each fabricated from an epoxy mold compound.

7. The memory card of claim 1 wherein:
the first encapsulation part is of a first thickness; and
the second encapsulation part is of a second thickness which exceeds the first thickness.

8. The memory card of claim 1 comprising multiple components mounted to the top surface of the substrate and electrically connected to the terminals thereof.

9. The memory card of claim 1 wherein the first and second encapsulation parts are configured to impart a prescribed form factor to the memory card.

10. The memory card of claim 1 wherein the first encapsulation part is sized and configured to cover the entirety of the top surface of the substrate.

11. The memory card of claim 8 wherein the components are selected from the group consisting of:
a semiconductor package;
a semiconductor die;
a passive component; and
combinations thereof.

12. The memory card of claim 11 wherein:
the semiconductor package and the passive component are surface mounted to the top surface of the substrate; and
the semiconductor die is wire bonded to the substrate through the use of a conductive wire.

13. A method for fabricating a memory card, the method comprising the steps of:
a) providing a substrate having opposed top and bottom surfaces and a plurality of terminals disposed on the bottom surface thereof;
b) forming a first encapsulation part on the bottom surface of the substrate;
c) mounting at least one component to the top surface of the substrate in a manner wherein the component is electrically connected to the terminals; and
d) forming a second encapsulation part on the top surface of the substrate in a manner encapsulating the component mounted thereto;
the first and second encapsulation parts formed in steps (b) and (d) each being exposed in the memory card and completely separated from each other by the substrate.

14. The method of claim 13 wherein step (b) comprises forming the first encapsulation part to include an opening therein, the terminals of the substrate being exposed in the opening.

15. The method of claim 13 wherein step (d) comprises forming a pair of coupling notches into respective ones of an opposed pair of sides of the second encapsulation part in opposed relation to each other.

16. The method of claim 13 wherein:
step (d) comprises forming a pair of guide slots into respective ones of an opposed pair of peripheral edge segments of the encapsulation part which extend in spaced, generally parallel relation to the terminals.

17. The method of claim 13 wherein step (d) comprises forming a recess in the second encapsulation part along a peripheral edge segment thereof which is disposed furthest from the terminals.

18. The method of claim 13 wherein steps (b) and (d) comprise forming the first and second encapsulation parts from an epoxy mold compound.

19. The method of claim 13 wherein:
step (b) comprises forming the first encapsulation part to be of a first thickness; and
step (d) comprises forming the second encapsulation part to be of a second thickness which exceeds the first thickness.

20. The method of claim 13 wherein step (c) comprises mounting and electrically connecting a plurality of components to the substrate.

21. The method of claim 20 wherein step (c) comprises:
1) surface mounting at least one of the components to the substrate; and
2) wire bonding at least one of the components to the substrate.

22. A method for fabricating a memory card, the method comprising the steps of:
a) providing a substrate having opposed top and bottom surfaces and a plurality of terminals disposed on the bottom surface thereof;
b) applying a mold compound to the bottom surface of the substrate;
c) mounting at least one component to the top surface of the substrate in a manner wherein the component is electrically connected to the terminals; and d) applying a mold compound to the top surface of the substrate in a manner encapsulating the component mounted thereto;

the mold compound applied to the substrate in steps (b) and (d) being exposed in the memory card, with the mold compound applied to the bottom surface being completely separated from the mold compound applied to the top surface by the substrate.

23. A memory card, comprising:

a substrate having opposed top and bottom surfaces and a plurality of terminals disposed on the bottom surface thereof;

at least one component mounted to the top surface of the substrate and electrically connected to the terminals thereof;

a first encapsulation part of a first thickness formed on the bottom surface of the substrate; and a second encapsulation part of a second thickness exceeding the first thickness formed on the top surface of the substrate and encapsulating the component mounted thereto, the second encapsulation part being completely separated from the first encapsulation part by the substrate;

the first and second encapsulation parts each being exposed in the memory card.

24. A method for fabricating a memory card, the method comprising the steps of:

a) providing a substrate having opposed top and bottom surfaces and a plurality of terminals disposed on the bottom surface thereof;

b) applying a mold compound to the bottom surface of the substrate at a first thickness;

c) mounting at least one component to the top surface of the substrate in a manner wherein the component is electrically connected to the terminals; and d) applying a mold compound to the top surface of the substrate at a second thickness which exceeds the first thickness and in a manner encapsulating the component mounted thereto;

the mold compound applied to the substrate in steps (b) and (d) being exposed in the memory card, with the mold compound applied to the bottom surface being completely separated from the mold compound applied to the top surface by the substrate.

* * * * *